United States Patent
Wang

(10) Patent No.: US 11,929,130 B2
(45) Date of Patent: Mar. 12, 2024

(54) METHOD AND DEVICE FOR TESTING SR CYCLE AS WELL AS METHOD AND DEVICE FOR TESTING AR NUMBER

(71) Applicant: CHANGXIN MEMORY TECHNOLOGIES, INC., Anhui (CN)

(72) Inventor: Peng Wang, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 244 days.

(21) Appl. No.: 17/440,335

(22) PCT Filed: Jan. 26, 2021

(86) PCT No.: PCT/CN2021/073814
§ 371 (c)(1),
(2) Date: Sep. 17, 2021

(87) PCT Pub. No.: WO2022/068127
PCT Pub. Date: Apr. 7, 2022

(65) Prior Publication Data
US 2022/0406394 A1    Dec. 22, 2022

(30) Foreign Application Priority Data

Sep. 30, 2020  (CN) .......................... 202011063892.1
Dec. 21, 2020  (CN) .......................... 202011521506.9

(51) Int. Cl.
*G11C 29/08*     (2006.01)
(52) U.S. Cl.
CPC .................................... *G11C 29/08* (2013.01)
(58) Field of Classification Search
CPC ......... G11C 29/08; G11C 7/04; G11C 29/023; G11C 29/50016; G11C 11/406
(Continued)

(56) References Cited

U.S. PATENT DOCUMENTS 5,793,776 A    8/1998  Qureshi
6,141,276 A    10/2000 Mullarkey
(Continued)

FOREIGN PATENT DOCUMENTS

CN    1324078 A    11/2001
CN    1612267 A    5/2005
(Continued)

OTHER PUBLICATIONS

International Search Report in the international application No. PCT/CN2021/104923, dated Sep. 29, 2021. 2 pages.
(Continued)

*Primary Examiner* — James C Kerveros
(74) *Attorney, Agent, or Firm* — Cooper Legal Group, LLC

(57) ABSTRACT

The present disclosure relates to the field of integrated circuit technologies, and provides a method and device for testing an SR cycle as well as a method and device for testing an AR number. The method for testing an SR cycle includes: executing a preset number of data-retention-capacity acquisition steps, the data-retention-capacity acquisition step including determining a preset refresh time; sending an SR entry command to control a memory to enter an SR operation; sending an SR exit command to control the memory to exit the SR operation after the memory executes the SR for the preset refresh time; detecting a current data retention capacity of the memory; obtaining a cycle of a function of the data retention capacity with respect to the corresponding preset refresh time; and determining the SR cycle of the memory with the cycle of the function.

19 Claims, 7 Drawing Sheets

(58) Field of Classification Search
USPC .......................................................... 714/718
See application file for complete search history.

(56) References Cited

U.S. PATENT DOCUMENTS

| | | | |
|---|---|---|---|
| 6,167,544 | A | 12/2000 | Brady |
| 6,272,588 | B1 | 8/2001 | Johnston |
| 6,317,852 | B1 | 11/2001 | Lau |
| 6,366,515 | B2 | 4/2002 | Hidaka |
| 6,538,953 | B2 | 3/2003 | Hidaka |
| 6,611,470 | B2 | 8/2003 | Hidaka |
| 7,184,358 | B2 | 2/2007 | Kobayashi |
| 7,975,170 | B2 * | 7/2011 | Hummler ............... G11C 11/406 365/222 |
| 9,361,954 | B2 * | 6/2016 | Yang ................. G11C 11/40611 |
| 10,528,423 | B2 * | 1/2020 | Lam ...................... G06F 3/0619 |
| 10,665,287 | B2 | 5/2020 | Lim et al. |
| 2002/0001246 | A1 | 1/2002 | Hidaka |
| 2002/0051396 | A1 | 5/2002 | Higashiho |
| 2002/0097626 | A1 | 7/2002 | Hidaka |
| 2002/0185337 | A1 * | 12/2002 | Miura ................. G06F 12/0246 185/11 |
| 2003/0128614 | A1 | 7/2003 | Hidaka |
| 2005/0105322 | A1 | 5/2005 | Kobayashi |
| 2005/0135171 | A1 | 6/2005 | Kim |
| 2005/0219890 | A1 * | 10/2005 | Riho .................... G11C 29/023 365/104 |
| 2007/0002657 | A1 | 1/2007 | Shim |
| 2010/0169726 | A1 * | 7/2010 | Kasuga ................ G11C 29/023 714/719 |
| 2010/0182862 | A1 * | 7/2010 | Teramoto ................. G11C 7/04 365/236 |
| 2012/0134224 | A1 * | 5/2012 | Shim ................. G11C 11/40615 365/201 |
| 2014/0355370 | A1 * | 12/2014 | Kim .................. G11C 11/40615 365/222 |
| 2015/0043294 | A1 | 2/2015 | Yang |
| 2019/0378565 | A1 * | 12/2019 | Yuan ........................ G11C 7/04 |
| 2022/0406394 | A1 | 12/2022 | Wang |

FOREIGN PATENT DOCUMENTS

| | | |
|---|---|---|
| CN | 1655280 A | 8/2005 |
| CN | 101069062 A | 11/2007 |
| CN | 102479543 A | 5/2012 |
| CN | 103035281 A | 4/2013 |
| CN | 103810126 A | 5/2014 |
| CN | 104167224 A | 11/2014 |
| CN | 105493192 A | 4/2016 |
| CN | 107742526 A | 2/2018 |
| CN | 109698001 A | 4/2019 |
| CN | 109949844 A | 6/2019 |
| CN | 110010173 A | 7/2019 |
| JP | 2008186584 A | 8/2008 |

OTHER PUBLICATIONS

English translation of the Written Opinion of the International Search Authority in the international application No. PCT/CN2021/104923, dated Sep. 29, 2021. 3 pages.

First Office Action of the U.S. Appl. No. 17/504,875, dated Sep. 8, 2023. 18 pages.

"JEDEC Standard DDR4 SDRAM JESD79-4B", (Revision of JESD79-4A, Nov. 2013), Jun. 2017, JEDEC Solid State Technology Association, Published by © JEDEC Solid State Technology Association 2017, 3103 North 10th Street Suite 240 South Arlington, VA 22201-2107.http://www.softnology.biz/pdf/JESD79-4B.pdf, 262 pages.

"JEDEC Standard Low Power Double Data Rate4(LPDDR4) JESD209-4C"(Revision of JESD209-4B, Feb. 2017), Jan. 2020, Published by © JEDEC Solid State Technology Association 2020 3103 North 10th Street Suite 240 South Arlington, VA 22201-2107, 357 pages.

Written Opinion cited in PCT/CN2021/073814, dated Jun. 29, 2021, 7 pages.

International Search Report as cited in PCT Application No. PCT/CN2021/073814 dated Jun. 29, 2021, 5 pages.

* cited by examiner

METHOD AND DEVICE FOR TESTING SR CYCLE AS WELL AS METHOD AND DEVICE FOR TESTING AR NUMBER

CROSS-REFERENCE TO RELATED APPLICATIONS

The present application is a national phase entry of International Application No.: PCT/CN2021/073814, filed on Jan. 26, 2021, which claims priority to Chinese Patent Application No. 202011063892.1, entitled "METHOD AND DEVICE FOR TESTING SR CYCLE" and filed on Sep. 30, 2020, and Chinese Patent Application No. 202011521506.9, entitled "METHOD AND DEVICE FOR TESTING AR NUMBER" and filed on Dec. 21, 2020. The entire contents of International Application No.: PCT/CN2021/073814, Chinese Patent Application No. 202011063892.1, and Chinese Patent Application No. 202011521506.9 are incorporated herein by reference.

TECHNICAL FIELD

The present disclosure relates to the field of integrated circuit technologies, in particular to a method and device for testing an SR cycle as well as a method and device for testing an AR number.

BACKGROUND

A Dynamic Random Access Memory (DRAM) is a semiconductor storage device commonly used in a computer, and is composed of plural memory cells arranged in an array. Usually, each memory cell includes a capacitor and a transistor, and in order to prevent data corruption caused by electric leakage of the transistor, a refresh operation is required to be performed on the DRAM continuously.

The refresh operation of the DRAM includes a self refresh (SR) and an auto refresh (AR); the SR means that the entire array is continuously and cyclically refreshed in sequence after a refresh command is obtained, and the AR means that a refresh interval may be set and a refresh may be automatically performed according to a time of the refresh interval.

Customers are unable to learn an SR cycle of the SR and an AR number required for the AR to refresh the entire array due to general customization by a DRAM manufacturer according to its own technological level. The present invention aims to provide a method for measuring the SR cycle and the AR number of the DRAM with a normal operation command.

It is to be noted that the above information disclosed in this Background section is only for enhancement of understanding of the background of the present disclosure and therefore it may contain information that does not form the prior art that is already known to a person of ordinary skill in the art.

SUMMARY

According to an aspect of the present disclosure, there is provided a method for testing an SR cycle used for a memory, the method including:
executing a preset number of data-retention-capacity acquisition steps, the data-retention-capacity acquisition steps including determining a preset refresh time;
sending an SR entry command to control the memory to enter an SR operation;
sending an SR exit command to control the memory to exit the SR operation after the memory executes the SR for the preset refresh time;
detecting a current data retention capacity of the memory;
obtaining a cycle of a function of the data retention capacity with respect to the corresponding preset refresh time; and
determining the SR cycle of the memory with the cycle of the function.

According to an aspect of the present disclosure, there is provided a device for testing an SR cycle used for a memory, including:
a data obtaining module configured to execute a preset number of data-retention-capacity acquisition steps, the data-retention-capacity acquisition step including determining a preset refresh time, send an SR entry command to control the memory to enter an SR operation, send an SR exit command to control the memory to exit the SR operation after the memory executes the SR for the preset refresh time, and detect a current data retention capacity of the memory; and
a data processing module configured to obtain a cycle of a function of the data retention capacity with respect to the corresponding preset refresh time, and determine the SR cycle of the memory with the cycle of the function.

According to an aspect of the present disclosure, there is provided a method for testing an AR number, the method including:
executing a preset number of AR operations to obtain a corresponding data retention capacity, the AR operation including sending an AR command and waiting for a first preset time;
changing the preset refresh number to obtain the corresponding data retention capacity;
obtaining a change curve of the data retention capacity with respect to the corresponding preset refresh number; and
determining the AR number with the change curve.

BRIEF DESCRIPTION OF DRAWINGS

The accompanying drawings herein are incorporated in and constitute a part of this specification, illustrate embodiments conforming to the present disclosure and, together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

DESCRIPTION OF EMBODIMENTS

Figure 1:
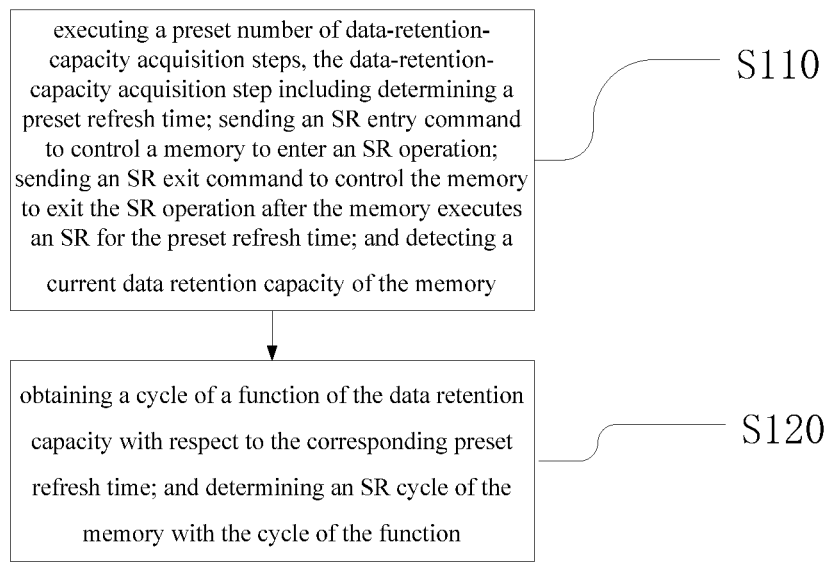
FIG. 1 schematically shows a flow chart of a method for testing an SR cycle according to an exemplary embodiment of the present disclosure.

The exemplary embodiment will now be described more fully with reference to the accompanying drawings. However, the exemplary embodiments can be implemented in a variety of forms and should not be construed as limited to the embodiments set forth herein. Rather, the embodiments are provided so that the present disclosure will be thorough and complete and will fully convey the concepts of exemplary embodiments to those skilled in the art. Throughout the drawings, similar reference signs indicate the same or similar structures, and their detailed description will be omitted.

Although relative terms such as "above" and "below" are used herein to describe a relative relation between one component and another component of icons, these terms are merely for convenience of this specification, for example, the directions of the examples in the accompanying drawings. It is to be understood that when the device of the icon is turned upside down, components described as "above" will become components described as "below". Other relative terms such as "high", "low", "top", "bottom", "left", "right" and so on also have similar meanings. When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc.

In a DRAM integrated circuit apparatus, an array of memory cells is typically arranged in rows and columns, such that a particular memory cell may be addressed by designating the row and column of the array thereof. A wordline connects the row to a bitline sense amplifier for data in a set of probe units. Then, in a read operation, a data subset of a "row selection" or "column selection" sense amplifier is selected for output.

The memory cell of a DRAM is "dynamic", which, in a sense, means that stored data may disappear after a relatively short period of time in typical charging and discharging processes of a storage capacitor. Therefore, to retain information, contents of the memory cell of the DRAM have to be refreshed. A charged or discharged state of the storage capacitor has to be reapplied to the individual memory cells repetitively to refresh the memory cells of the DRAM. Usually, a DRAM manufacturer specifies a refresh time for holding the data in the memory cell of the DRAM.

A refresh operation is similar to the read operation, but no data is output. After read out by the sense amplifier, the data in the memory cell is restored to be rewritten into the memory cell. Thus, the data is "refreshed". The refresh operation is performed by activating the wordline according to a row address and activating the sense amplifier.

When a DRAM chip runs, during receipt of an SR entry command, the refresh operation is automatically and cyclically performed in the chip. During an AR, receipt of other commands to the chip is interrupted, and the refresh is performed. After receiving an SR exit command, the chip is allowed to receive and execute other commands.

In a manufacturing process of the chip, an SR cycle of the chip is set by a chip designer, and whether the SR cycle accords with a process level of the chip is necessary to be verified by detecting the SR cycle of the chip at a later stage, so as to guide subsequent design and production. In order to improve accuracy of measurement of the SR cycle, the present exemplary embodiment provides a method and device for testing an SR cycle, so as to accurately, simply and conveniently measure the SR cycle of the DRAM by a normal operation command, thus providing a reference for a design of the SR cycle of the DRAM chip.

A data retention capacity is the longest time that the DRAM may retain data without loss and resist electric leakage without refreshes, and the data retention capacity of the DRAM is strongly related to the SR cycle and an AR number. Based on the data retention capacity of the memory, the present exemplary embodiment of the present disclosure provides a method for testing an SR cycle. Reference is made to FIG. 1 which shows a flow chart of a method for testing an SR cycle according to an exemplary embodiment of the present disclosure. Referring to FIG. 1, the method for testing an SR cycle used for a memory may include the following steps:

S110: executing a preset number of data-retention-capacity acquisition steps, the data-retention-capacity acquisition step including determining a preset refresh time; sending an SR entry command to control the memory to enter an SR operation; sending an SR exit command to control the memory to exit the SR operation after the memory executes the SR for the preset refresh time; and detecting a current data retention capacity of the memory.

S120: obtaining a cycle of a function of the data retention capacity with respect to the corresponding preset refresh time; and determining the SR cycle of the memory with the cycle of the function.

In the method for testing an SR cycle according to the present exemplary embodiment, firstly, the longest time that the memory may retain data without loss without refreshes may be determined by detecting the current data retention capacity of the memory; the data may be guaranteed not to be lost as long as a refresh action is performed within the longest time; since the data retention capacity is strongly related to the SR cycle, the SR cycle may be accurately measured with inconsistency of the data retention capacity, so as to verify an SR function and analyze different DRAM products. Secondly, the above-mentioned data retention capacity is obtained after the SR is performed for the preset refresh time, and the obtained data retention capacities are different under different preset refresh times, such that the data retention capacity is related to the preset refresh time and naturally the SR cycle, and the SR cycle may be determined by the cycle of the simple function of the data retention capacity with respect to the corresponding preset refresh time, with a simple detection process and an easy data processing operation; thirdly, the method for testing an SR cycle according to the present exemplary embodiment avoids overlapped cycles in conventional high-temperature measurement, and thus has higher measurement accuracy and is suitable for measurement within various temperature ranges.

The method for testing an SR cycle according to the present exemplary embodiment will be further described below.

S110: executing the preset number of data-retention-capacity acquisition steps, the data-retention-capacity acquisition step including determining the preset refresh time; sending the SR entry command to control the memory to enter the SR operation; sending the SR exit command to control the memory to exit the SR operation after the memory executes the SR for the preset refresh time; and detecting the current data retention capacity of the memory.

In practical applications, the DRAM has a common data retention capacity of 64 ms, which means an effective time of 64 ms for all stored data to be read out correctly without refreshes of the DRAM chip, and the data may be lost beyond 64 ms. Within the 64 ms, the memory is required to be refreshed to ensure that the data is not lost, and therefore, the SR cycle is strongly related to the data retention capacity of the DRAM. In the present exemplary embodiment, accuracy of acquisition of the SR cycle may be improved by acquiring the data retention capacity.

In the production and manufacturing process of the DRAM, resistance of the capacitor in each bit of the memory cell of the DRAM to the electric leakage is naturally inconsistent due to a process manufacturing precision limit: for example, the data of one capacitor may be retained for 200 ms; that is, this capacitor has a data retention capacity of 200 ms; the data of another nearby capacitor may be retained for 192 ms; that is, this capacitor has a data retention capacity of 192 ms. That is, the plurality of memory cells in the DRAM may have the completely inconsistent data retention capacities; for the DRAM, a certain inconsistency exists in the data retention capacity of each memory cell, with the result that the data retention capacity also varies cyclically with the refresh time.

The periodicity of the data retention capacity is described below by a specific obtaining method of the data retention capacity.

In the present exemplary embodiment, first, before detection of the data retention capacity of the memory, the memory is refreshed for the preset refresh time X; that is, the preset refresh time X is determined, and then the SR entry command is sent to control the memory to enter the SR operation; and then, after the memory performs the SR for the preset refresh time X, the SR exit command is sent to control the memory to exit the SR operation. One SR operation may be completed by sending the SR entry command and the SR exit command as mentioned above.

It should be noted that the SR operation of the DRAM is an operation which is automatically and cyclically performed in sequence from row 0 to row N of the array of the DRAM, and specifically includes: reading data from the memory cell of the memory and then rewriting the data into the memory cell.

The start and the end of the entire SR operation are both completed by sending the respective commands; that is, the SR operation may be entered by sending the SR entry command, and exited by sending the SR exit command Both the SR entry command and the SR exit command are standard commands for the DRAM.

In the present exemplary embodiment, the SR time of the memory may be controlled by sending the SR entry command and the SR exit command; that is, the refresh for the preset refresh time X is realized by sending the SR entry command and the SR exit command according to the determined preset refresh time X, and it is not necessary to refresh the data of the entire array.

In the present exemplary embodiment, the SR entry command further includes: controlling the memory to be powered down and then powered up, and rewriting data before controlling the memory to enter the SR operation; that is, each SR operation is a brand new operation and not performed on the basis of the previous SR operation.

The preset refresh time X may have a size determined according to actual needs; for example, the preset refresh time X may be a plurality of refresh times at an interval of 20 μs, such as 0 μs, 20 μs, 40 μs, 60 μs, or the like. The specific preset refresh time X is not particularly limited in the present exemplary embodiment.

Secondly, the current data retention capacity of the memory is detected after the end of the SR operation for each preset refresh time X.

In the present exemplary embodiment, the step of detecting a current data retention capacity of the memory includes: performing a data reading step on the memory, the data reading step including determining a preset waiting time W; waiting for the preset waiting time W after the memory executes the SR for the preset refresh time X; reading data of the memory after waiting for the preset waiting time W; if the data is read, incrementing the preset waiting time W, and proceeding to the data reading step to continuously perform the data read operation on the memory. If the data of the memory may still be read after waiting for the incremented preset waiting time W, the preset waiting time W is continuously incremented, and this process is repeated until the data is unable to be read. If the data is not read, the previous preset waiting time W is determined as the data retention capacity, which refers to the previous longest preset waiting time W in which the data may be read.

It should be noted that reading the data of the memory means reading all the data in the entire array, and the data may be read only when all the data may be read out.

Figure 2:
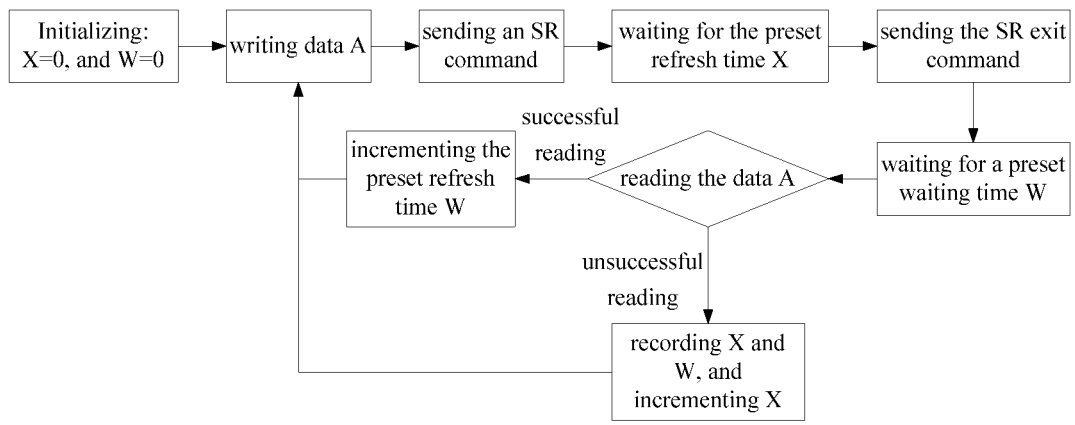
FIG. 2 schematically shows a flow chart of detection of a data retention capacity according to an exemplary embodiment of the present disclosure.

Reference is made to FIG. 2 which schematically shows a flow chart of detection of the data retention capacity according to an exemplary embodiment of the present disclosure. As shown in FIG. 2, the detection includes: initializing the preset refresh time X and the preset waiting time W, and making X=0 and W=0; after the initialization, writing data; for example, writing data A into the whole array of the memory; then, sending the SR entry command; waiting for the preset refresh time X, and executing the SR operation during the time; next, sending the SR exit command to exit the SR operation; waiting for the preset waiting time W; reading the data A after waiting for the preset waiting time W; if the data A is read (i.e., successful reading), incrementing the preset waiting time W, and proceeding to the step of writing the data A; repeating the process until the data A is unable to be read (i.e., unsuccessful reading), determining the previous longest preset waiting time W in which the data may be read as the data retention capacity, recording W and corresponding X, incrementing the preset refresh time X, and reentering the step of writing the data A, so as to obtain the data retention capacity after the SR for the next preset refresh time X. If the data A is unable to be read from the beginning, the preset waiting time W may be decremented until the data A may be read, and the current preset waiting time W in which the data may be read is determined as the data retention capacity.

During acquisition of the next data retention capacity, the acquisition may be started with a W value at the end of previous acquisition, or the W value may be set to be 0 for recalculation, which is not particularly limited in the present exemplary embodiment. In addition, the W value may also be taken according to the actual data retention capacity of the memory, such that an accurate W value may be obtained at the highest speed; the step diameter of the increment of the W value may also be set according to actual conditions, for example, 1 to 30 μs, which is not particularly limited in the exemplary embodiment of the present disclosure.

In the present exemplary embodiment, during the execution of each of the preset number of the data-retention-capacity acquisition steps, a different preset refresh time X may be determined (for example, by incrementing X), thereby obtaining a plurality of pairs of X and W values for subsequent analysis of the function. The preset number may be 500, 600, or the like; that is, 500 or 600 X values are necessary to be determined correspondingly; for example, when the step diameter is 1 ms, the X value may be taken from 0 to 600 ms.

In addition, the W value may be taken according to the actual data retention capacity of the memory, such that an accurate W value may be obtained at the highest speed.

S120: after S110, obtaining the cycle of the function of the data retention capacity with respect to the corresponding preset refresh time; and determining the SR cycle of the memory with the cycle of the function.

In the present exemplary embodiment, the function W=Ret(X) of the data retention capacity W with respect to the corresponding preset refresh time X may be obtained, and due to the natural inconsistency of the data retention capacity W of each row of the array of the DRAM, the function Ret(X) may also be a periodic function, and the cycle thereof is a time for the SR entry command to refresh the entire array once, i.e., the SR cycle needed to be measured in the present exemplary embodiment.

In practical operations, the step of obtaining a cycle of a function of the data retention capacity with respect to the corresponding preset refresh time may further include: obtaining a curve of the data retention capacity changing with the preset refresh time; and determining the cycle of the function according to the curve, the cycle of the curve being the cycle of the function, and the cycle of the function being the SR cycle.

All the rows of the entire array are automatically and cyclically refreshed in the SR operation. For example, the DRAM chip has 100 rows, and the SR cycle is 50 μs;

1) if the preset refresh time X is determined to be 60 μs, after one refresh of the 100 rows of the entire array, a refresh is performed again from row 1 to about row 20, and at this point, the data retention capacity is W1=Ret(60 μs).

2) if the preset refresh time X is determined to be 110 μs, after two refreshes of the 100 rows of the entire array, a refresh is performed again from row 1 to about row 20, and at this point, the data retention capacity is W2=Ret(110 μs).

Since the refresh is performed to row 20 in both cases 1) and 2), the data retention capacity of the entire array should depend on the weakest row of the last 80 rows, and therefore, W1=W2.

From the above, the function Ret(X) is a periodic function with the cycle being the SR cycle. The SR cycle may be obtained when the function Ret(X) is obtained, and the SR cycle obtained in the present exemplary embodiment has higher precision compared with an existing method of simulating an SR cycle between two adjacent rows by measuring a supply current waveform of a chip in an SR process.

Figure 3:
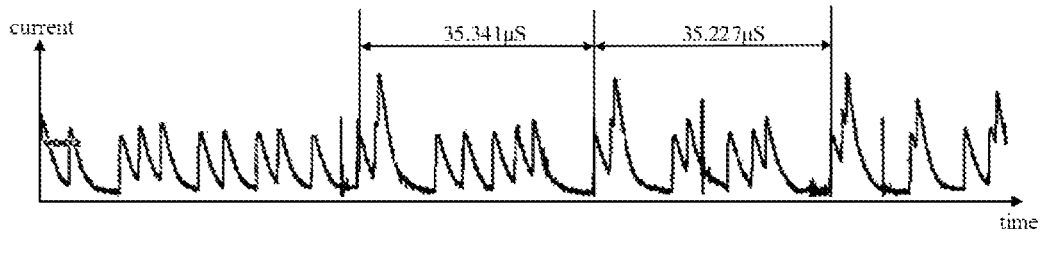
FIG. 3 schematically shows a schematic diagram of an experimental result of a current waveform obtained with an existing current test method.

Reference is made to FIG. 3 which schematically shows a schematic diagram of an experimental result of a current waveform obtained with an existing current test method. As shown in FIG. 3, the cycles obtained from a current waveform diagram are 35.341 μs and 35.227 μs, a certain error exists between the two cycles, and the cycle value is a refresh interval between two adjacent internal refreshes, and the SR cycle to be obtained in the present exemplary embodiment may be obtained by multiplying the cycle value with a total internal refresh number, but the total refresh number of the full array of the DRAM is only known by a chip designer. When the internal refresh number required for refreshing the entire array is unknown, the SR cycle of the full array cannot be obtained with the conventional current test method. CC in FIG. 3 refers to a chip CC, and is used as a label for being distinguished from different chips AA and BB hereinafter.

Figure 4:
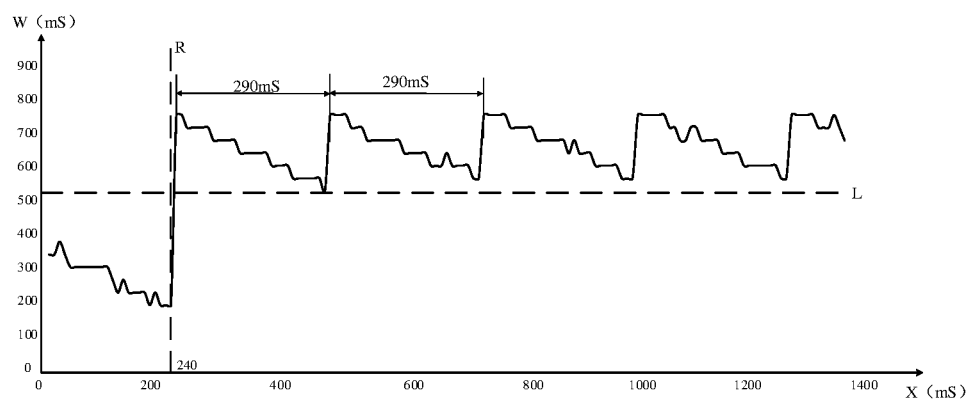
FIG. 4 schematically shows a schematic diagram of an experimental result obtained with a method for testing an SR cycle according to an exemplary embodiment of the present disclosure.

Reference is made to FIG. 4 which schematically shows a schematic diagram of an experimental result obtained with the method for testing an SR cycle according to the present exemplary embodiment. As shown in FIG. 4, X serves as the abscissa, and W serves as the ordinate; it may be observed that the function W=Ret(X) is a periodic function, and the cycle of 290 ms thereof is the SR cycle of the memory. The cycle of 290 ms is the SR cycle of the entire array. FIGS. 3 and 4 show the measured results of a same chip IDD62, and knowing that 8192 internal refreshes are required for refreshing the entire array of the chip, the internal refresh interval is 290 ms/8192=34 μs, which is close to the measured result in FIG. 3, thereby verifying feasibility of the method for testing an SR cycle according to the present exemplary embodiment.

Figure 5:
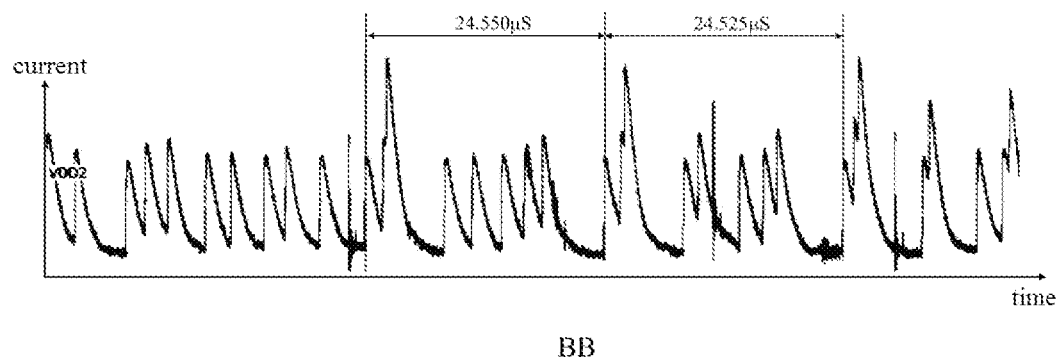
FIG. 5 schematically shows a schematic diagram of an experimental result of another current waveform obtained with an existing method for testing an SR cycle by a current.

Reference is made to FIG. 5 which schematically shows a schematic diagram of an experimental result of another current waveform obtained with an existing method for testing an SR cycle by a current. As shown in FIG. 5, the cycles obtained from a current waveform diagram are 24.550 μs and 24.525 μs, and the cycle value is a refresh interval between two adjacent rows, and the SR cycle to be obtained in the present exemplary embodiment may be obtained by multiplying the cycle value by the total internal refresh number.

Figure 6:
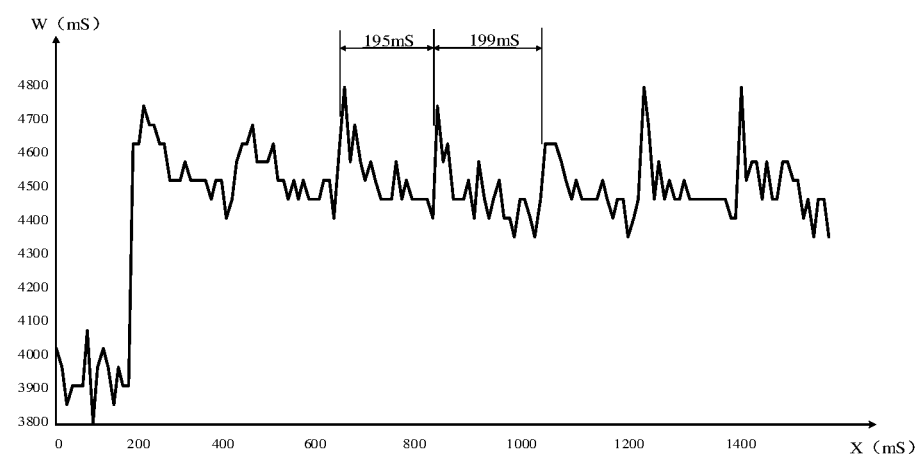
FIG. 6 schematically shows a schematic diagram of another experimental result obtained with a method for testing an SR cycle according to an exemplary embodiment of the present disclosure.

Reference is made to FIG. 6 which schematically shows a schematic diagram of another experimental result obtained with the method for testing an SR cycle according to the present exemplary embodiment. As shown in FIG. 6, X serves as the abscissa, and W serves as the ordinate; it may be observed that the function W=Ret(X) is a periodic function, and an average value 197 ms of the cycles of 195 ms and 199 ms thereof is the SR cycle of the memory. The cycle of 197 ms is the SR cycle of the entire array. FIGS. 5 and 6 show the measured results of a same chip VDD2, and the chip has an internal refresh number of 8192, such that the internal refresh interval is 197 ms/8192=24.05 μs, which is close to the measured result in FIG. 5, thereby further verifying the feasibility of the method for testing an SR cycle according to the present exemplary embodiment.

In the existing method for testing an SR cycle by a current, when an ambient temperature of the chip is increased and the chip has a high SR rate, adjacent current cycles may be overlapped, and at this point, the cycle is unable to be distinguished with the method for testing an SR cycle by a current. The exemplary embodiment of the present disclosure depends on the natural difference characteristic of the data retention capacity of the array of the DRAM, and thus avoids the overlapped condition and is still suitable for the case where the SR rate is high at a high temperature; that is, the method for testing an SR cycle according to the present exemplary embodiment has a wider temperature application range.

In actual operations, the smaller the step diameter of the increment of the preset waiting time W, the higher the precision of the measured data retention capacity, but meanwhile, the number of tests will be increased, and therefore, a test time will be longer.

For example, it is assumed that the SR is exited after performed for the preset refresh time X, and at this point, the array of the DRAM has a data retention capacity W, and it is assumed that the cycle for self-refreshing the entire array of the DRAM in sequence is P=45 μs (to be measured).

Test condition A: after repeated tests with X=0 μs, 20 μs, 40 μs, 60 μs (X=0-100 μs, and the step diameter is equal to 20 μs), the corresponding data retention capacities of the entire array of the DRAM are W=200 ms, 180 ms, 200 ms, 180 ms . . . .

Measurement result: W=Ret(X) has a cycle of 40 μs, and the test time=6 points in the X direction*4 points in the W direction=24U (assuming that the time for one measurement is U).

Test condition B: after repeated tests with X=0 μs, 5 μs, 15 μs, 20 μs (X=0-100 μs, and the step diameter is equal to 5 μs), the data retention capacities of the entire array of the DRAM are W=205 ms, 165 ms, 170 ms, 160 ms (W=160-220 ms, with the step diameter of 5 ms);

Measurement result: W=Ret(X) has a cycle of 45 μs, and the test time=21 points in the X direction*13 points in the W direction=273U (assuming that the time for one measurement is U).

It may be observed that the test condition B has a more precise result than the test condition A, but has smaller step diameters in the X and W directions, and therefore takes a longer time (273U>24U).

In the present exemplary embodiment, as shown in FIG. 4, the row with the worst data retention capacity in the array of the memory may be determined to be 240/290*65536=54236 according to the preset refresh time 240 (the X value corresponding to the dotted line R) corresponding to the lowest data retention capacity in the function W=Ret(X). That is, in the array of the chip, the row 54236 in the total 65536 rows has the worst data retention capacity.

That is, the row 54236 with the worst data retention capacity may be determined according to the proportion 240/290 of the preset refresh time 240 ms corresponding to the lowest data retention capacity in the function W=Ret(X) accounting for the SR cycle 290 ms.

As may also be seen from FIG. 4, the W value of the data retention capacity in the first 240 ms is significantly smaller than that of the data retention capacity after 240 ms, which shows that after the weakest row is self-refreshed once, the data retention capacity of the whole chip is improved significantly, and the data retention capacity of the row with the worst data retention capacity is restored to be higher than 500 ms (the W value corresponding to the dotted line L), thereby also showing importance of the SR. This also shows effectiveness of the method for testing an SR cycle according to the embodiment of the present disclosure from another aspect.

In practical applications, the weakest row may also be determined to restore and adjust a generation technology, so as to provide a basis for later production guidance.

In summary, the preset number of data-retention-capacity acquisition steps are performed, the function of the data retention capacity with respect to the corresponding preset refresh time is obtained, and according to the function, not only the SR cycle of the memory may be determined, but also the row address with the worst data retention capacity may be obtained. The SR cycle may be determined by the simple function of the data retention capacity with respect to the corresponding preset refresh time, with a simple detection process and an easy data processing operation; since the function is also a periodic function, the SR cycle may be determined with the cycle of the function, thereby improving the precision of the determination result. Moreover, the method according to the present disclosure avoids the overlapped cycles in the conventional high-temperature measurement, and thus has higher measurement accuracy, and is suitable for measurement within various temperature ranges. The determined weakest row may also be used for the later production guidance, such that the generation technology may be restored and adjusted to improve a process yield of the whole chip.

It should be noted that, steps of the method in the present invention are described in a specific sequence in the accompanying drawings; however, this does not require or imply that the steps must be executed based on the specific sequence, or that an expected result cannot be implemented unless all of the shown steps are executed. Additionally or alternatively, some steps may be omitted, multiple steps may be combined into one step for execution, and/or one step may be broken down into multiple steps for execution.

Figure 7:
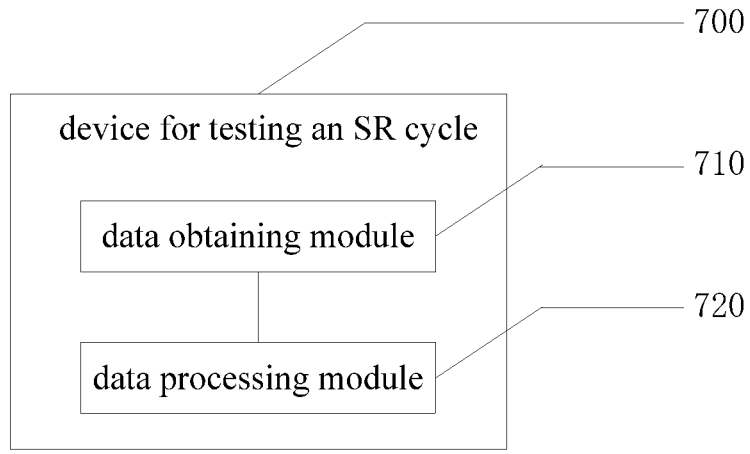
FIG. 7 schematically shows a block diagram of a device for testing an SR cycle according to an exemplary embodiment of the present disclosure.

Furthermore, the present exemplary embodiment further provides a device for testing an SR cycle used for a memory. Referring to FIG. 7, the device 700 for testing the SR cycle may include a data obtaining module 710 and a data processing module 720.

The data obtaining module 710 may be configured to execute a preset number of data-retention-capacity acquisition steps, the data-retention-capacity acquisition step including determining a preset refresh time, send an SR entry command to control the memory to enter an SR operation, send an SR exit command to control the memory to exit the SR operation after the memory executes the SR for the preset refresh time, and detect a current data retention capacity of the memory; and The data processing module 720 may be configured to obtain a cycle of a function of the data retention capacity with respect to the corresponding preset refresh time, and determine the SR cycle of the memory with the cycle of the function.

The specific details of the above-mentioned virtual modules of the device for testing an SR cycle are described in detail in the corresponding method for testing an SR cycle, and therefore are not repeated herein.

Usually, each memory cell in the DRAM includes the capacitor and a transistor, the transistor has a gate connected with the wordline, a drain connected with a bitline, and a source connected with the capacitor, and a voltage signal on the wordline may control the transistor to be turned on or off, so as to read data information stored in the capacitor through the bitline or write data information into the capacitor through the bitline for storage. Due to electric leakage of the transistor in reality, a number of charges stored in the capacitor is not enough to correctly discriminate data, resulting in data corruption.

Therefore, the DRAM is necessary to be refreshed continuously to keep data from being lost. The refresh operation includes an AR and an SR. The refresh operation is similar to the read operation, but no data is output; usually, the charged or discharged state of the capacitor is reapplied to the individual memory cells repetitively to refresh the memory cells of the DRAM. After read out by the sense amplifier, the data in the memory cell is restored to be rewritten into the memory cell. Thus, the data is "refreshed", and the refresh operation is performed by activating the wordline according to the row address and activating the sense amplifier.

For the AR, the number of the rows is limited in each refresh, and usually, the entire array may be refreshed once with plural refreshes. For example, if the entire array has 100 rows and the number of the rows is 4 in each AR, 25 ARs are required to refresh the entire array. Generally, performances, such as power consumption of the DRAM, adoption of a row hammer protection circuit design, or the like, may be judged by the AR number, thereby performing comparative analysis, competitive product analysis, or the like, on the DRAM.

The data retention capacity is the longest time that the DRAM may retain data without loss and resist electric leakage without refreshes. The data retention capacity of the DRAM is strongly related to the SR cycle and the AR number. Based on the data retention capacity of the memory, the exemplary embodiment of the present disclosure provides a method and device for testing an AR number, so as to accurately, simply and conveniently measure the AR number of the full array of the DRAM by a normal operation command.

Figure 8:
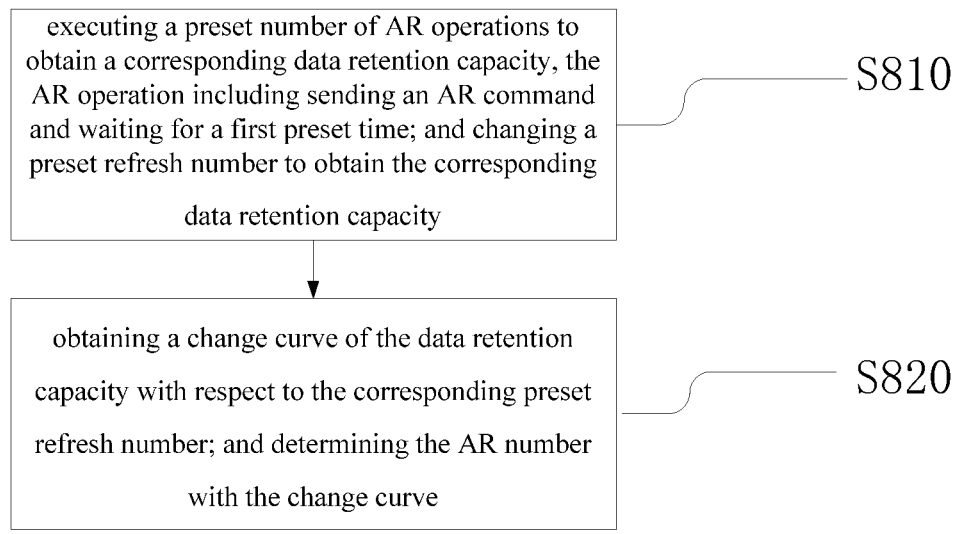
FIG. 8 schematically shows a flow chart of a method for testing an AR number according to an exemplary embodiment of the present disclosure.

Reference is made to FIG. 8 which shows a flow chart of a method for testing an AR number according to an exemplary embodiment of the present disclosure. Referring to FIG. 8, the method for testing an AR number used for the full array of the DRAM may include the following steps:

S810: executing a preset number of AR operations to obtain a corresponding data retention capacity, the AR operation including sending an AR command and waiting for a first preset time; and changing the preset refresh number to obtain the corresponding data retention capacity.

S820: obtaining a change curve of the data retention capacity with respect to the corresponding preset refresh number; and determining the AR number with the change curve.

In the method for testing an AR number according to the exemplary embodiment of the present disclosure, on the one hand, the longest time that the memory may retain data without loss without refreshes may be determined by detecting the current data retention capacity of the memory; the data may be guaranteed not to be lost as long as a refresh action is performed within the longest time; since the data retention capacity is strongly related to the AR number, the AR number may be accurately measured with inconsistency of the data retention capacity. On the other hand, the above-mentioned data retention capacity is obtained after the change of the preset refresh number and after the different preset number of ARs; therefore, the obtained data retention capacities are different under different preset refresh numbers, the data retention capacity is related to the preset refresh number and naturally the AR number, and the AR number may be determined by the simple change curve of the data retention capacity with respect to the corresponding preset refresh number, with a simple detection process and an easy data processing operation.

The method for testing an AR number according to the present exemplary embodiment will be further described below.

S810: executing the preset number of AR operations to obtain the corresponding data retention capacity, the AR operation including sending the AR command and waiting for the first preset time; and changing the preset refresh number to obtain the corresponding data retention capacity.

In practical applications, the DRAM has a common data retention capacity of 64 ms, which means an effective time of 64 ms for all stored data to be read out correctly without refreshes of the DRAM chip, and the data may be lost beyond 64 ms. Within the 64 ms, the memory is necessary to be refreshed to ensure that the data is not lost, and therefore, the preset refresh number is strongly related to the data retention capacity of the DRAM. In the present exemplary embodiment, by obtaining the data retention capacity corresponding to the preset refresh number, a change rule of the data retention capacity with respect to the preset refresh number may be obtained, so as to determine the AR number required for refreshing the entire array once.

In the production and manufacturing process of the DRAM, resistance of the capacitor in each bit of the memory cell of the DRAM to the electric leakage is naturally inconsistent due to a process manufacturing precision limit: for example, the data of one capacitor may be retained for 200 ms; that is, this capacitor has a data retention capacity of 200 ms; the data of another nearby capacitor may be retained for 192 ms; that is, this capacitor has a data retention capacity of 192 ms. That is, the plurality of memory cells in the DRAM may have the completely inconsistent data retention capacities; for the DRAM, a certain inconsistency exists in the data retention capacity of each memory cell, with the result that the data retention capacity also varies cyclically with the refresh number.

In the exemplary embodiment of the present disclosure, the AR number is the number of the ARs required for refreshing the entire array once. If plural ARs are performed, the entire array may be refreshed repeatedly, such that the data retention capacity may also change cyclically as the number of the ARs increases.

The periodicity of the data retention capacity is described below by a specific obtaining method of the data retention capacity.

In the present exemplary embodiment, the obtaining method includes: first, before detection of the data retention capacity of the memory, performing the preset number N of AR operations on the memory; that is, sending the AR command to control the memory to enter the AR operation; meanwhile, waiting for the first preset time; and repeatedly executing, N times, the actions of sending the AR command and waiting for the first preset time. The memory may enter an AR state after receiving the AR command and automatically exit after the refresh, one AR is generally performed by one AR command, a time of one AR is about hundreds of nanoseconds, and the memory is guaranteed to finish the AR operation by setting and waiting for the first preset time.

In the exemplary embodiment of the present disclosure, the first preset time is longer than the time of one AR; for example, the first preset time may be longer than or equal to 25 μs, such that the memory performs one AR after waiting for the first preset time. Then, the obtaining method includes: after the first preset time, automatically sending the AR command again, waiting for 25 µs, repeatedly executing the present number of refresh operations, and then acquiring the current data retention capacity of the memory to obtain the data retention capacity corresponding to the preset refresh number. Generally, the longer the first preset time, the higher the accuracy of the measurement.

Next, by changing the preset refresh number, a plurality of groups of preset refresh numbers and corresponding data retention capacities may be obtained, such that the plurality of groups of data are analyzed and calculated to obtain the AR number.

It should be noted that, each time the preset number of AR operations are performed, the first preset time to wait is identical, so as to maintain a comparability of the data, improve precision of data comparison, and avoid introducing other factors.

It should be noted that the AR operation of the DRAM is an operation which is automatically and cyclically performed in sequence from row 0 to row L of the array of the DRAM, and specifically includes: reading data from the memory cell of the memory and then rewriting the data into the memory cell.

In the present exemplary embodiment, the data of the entire array may not be refreshed completely each time after the preset number of AR operations are performed, since the AR number required for refreshing the entire array of the memory is unknown during a test.

In the present exemplary embodiment, each time before the preset number of AR operations are performed, the memory is further necessary to be controlled to be powered down and then up, and the data is rewritten; that is, each execution of the preset number of AR operations is a brand new operation, and is not performed on the basis of the previous preset number of AR operations, such that different preset refresh numbers have identical refresh conditions, and the obtained data retention capacity is only affected by the preset refresh number.

The preset refresh number N may be determined according to actual needs, for example, a plurality of refresh numbers with a step diameter of 256, such as 256, 512, 768, 1024, 1280, or the like.

In practical applications, the step diameter of the plurality of preset refresh numbers N may be determined according to practical situations, for example, less than or equal to 256. In general, the smaller the step diameter of the test, the higher the measurement precision, and the more accurate the obtained change curve. The specific preset refresh number N and the step diameter thereof are not particularly limited in the present exemplary embodiment.

In addition, the current data retention capacity of the memory is detected after the end of every preset number N of AR operations.

In the present exemplary embodiment, the step of obtaining a corresponding data retention capacity includes: executing a data reading step on the memory, the data reading step including determining a second preset time Y; waiting for the second preset time Y after the preset number N of AR operations are performed on the memory; reading data of the memory after waiting for the second preset time Y; and if the data is read, incrementing the second preset time Y, and proceeding to the data reading step to continuously perform the data reading step on the memory. If the data of the memory may still be read after waiting for the incremented second preset time Y, the second preset time Y is incremented continuously, the process is repeated until the data is unable to be read, and the previous second preset time Y is determined as the data retention capacity, with the previous second preset time Y referring to the previous longest second preset time Y in which the data may be read.

In addition, in the process of obtaining the data retention capacity, if the data is not read in the beginning, the data retention capacity may be acquired by decrementing the second preset time Y; specifically, if the second preset time Y set for the first time is over high, such that the data is not read, the second preset time Y may be decremented, and the data reading step is executed again until the data may be read, and the current second preset time Y corresponding to the read data is determined as the data retention capacity.

It should be noted that reading the data of the memory means reading all the data in the entire array, and the data may be read only when all the data may be read out.

In practical applications, the specific increment or decrement is flexibly applied according to the initially set second preset time Y, and Y may be 50 µs, 100 µs, or the like, which is not particularly limited in the present exemplary embodiment.

Figure 9:
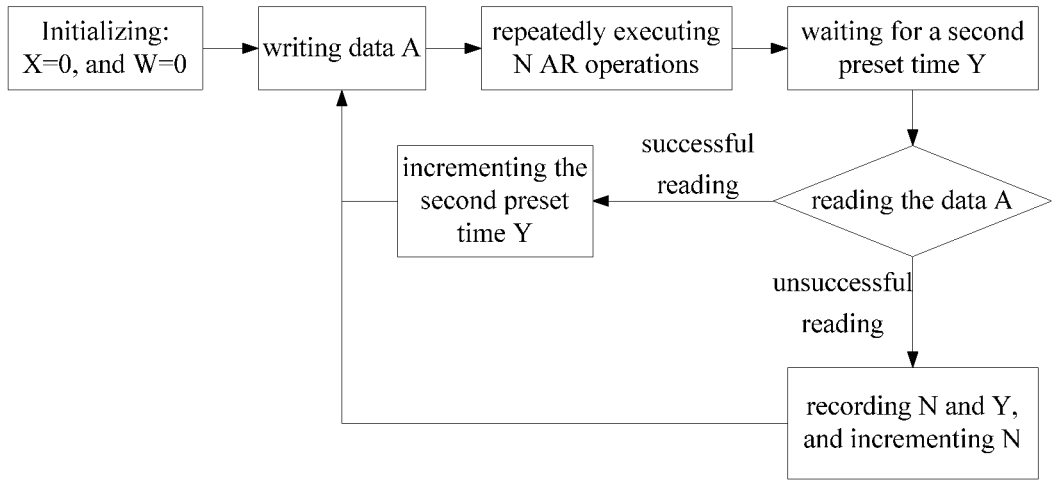
FIG. 9 schematically shows a flow chart of detection of a data retention capacity in a method for testing an AR number according to an exemplary embodiment of the present disclosure.

Reference is made to FIG. 9 which schematically shows a flow chart of detection of one data retention capacity according to an exemplary embodiment of the present disclosure. As shown in FIG. 9, the detection includes: initializing the preset refresh number N and the second preset time Y, and making N=0 and Y=0; after the initialization, writing data; that is, writing data A into the whole array of the memory; then, repeatedly executing N AR operations, each AR operation including sending the AR command and waiting for the first preset time; next, waiting for the second preset time Y; reading the data A after waiting for the second preset time Y; if the data A is read (i.e., successful reading), incrementing the second preset time Y, and proceeding to the step of writing the data A; repeating the process until the data A is unable to be read (i.e., unsuccessful reading), determining the previous longest second preset time Y in which the data may be read as the data retention capacity, recording Y and corresponding N, incrementing the preset refresh number N, and reentering the step of writing the data A, so as to obtain the data retention capacity after the next preset number N of AR operations. During acquisition of the next data retention capacity, the acquisition may be started with the Y value at the end of previous acquisition, or the Y value may be set to be 0 for recalculation, which is not particularly limited in the present exemplary embodiment.

Figure 10:
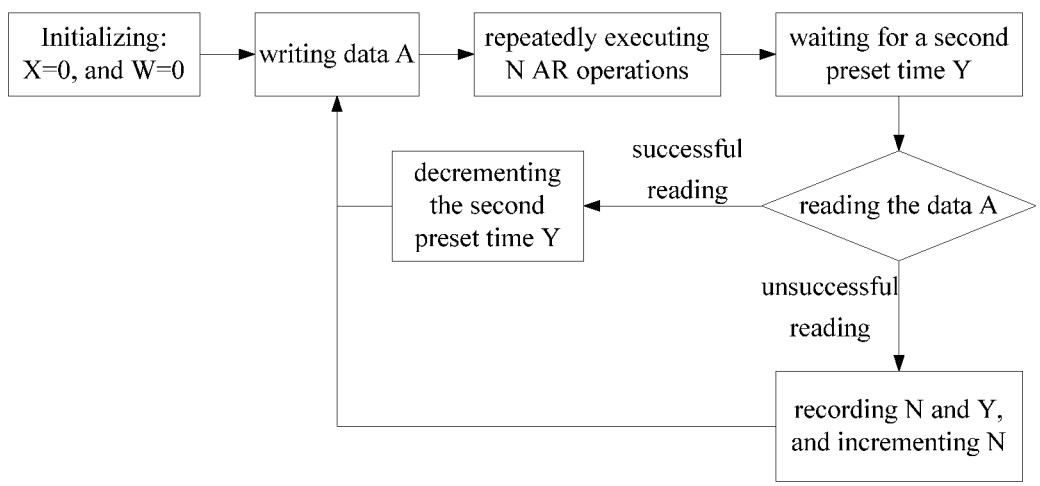
FIG. 10 schematically shows a flow chart of detection of another data retention capacity in a method for testing an AR number according to an exemplary embodiment of the present disclosure.

Reference is made to FIG. 10 which schematically shows a flow chart of detection of another data retention capacity according to an exemplary embodiment of the present disclosure. As shown in FIG. 10, the detection includes: initializing the preset refresh number N and the second preset time Y, and making N=0 and Y=0; after the initialization, writing data; that is, writing data A into the whole array of the memory; then, repeatedly executing N AR operations, each AR operation including sending the AR command and waiting for the first preset time; next, waiting for the second preset time Y; reading the data A after waiting for the second preset time Y; if the data A is not read (i.e., unsuccessful reading), decrementing the second preset time Y, and proceeding to the step of writing the data A; repeating the process until the data A is read (i.e., successful reading), determining the current second preset time Y in which the data may be read as the data retention capacity, recording Y and corresponding N, incrementing the preset refresh number N, and reentering the step of writing the data A, so as to obtain the data retention capacity after the next preset number N of AR operations. During acquisition of the next data retention capacity, the acquisition may be started with the Y value at the end of previous acquisition, or the Y value may be set to be 0 for recalculation, which is not particularly limited in the present exemplary embodiment.

In practical applications, the value of the second preset time Y may also be taken according to the actual data retention capacity of the memory, such that an accurate Y value may be obtained at the highest speed; the step diameter of the increment or decrement of the Y value may also be set according to actual conditions, for example, 1 to 30 μs; generally, the smaller the step diameter of the increment or decrement of the Y value, the more accurate the measured data retention capacity, but meanwhile, the number of tests will be increased, and therefore, a test time will be longer.

S820: after S810, obtaining the change curve of the data retention capacity with respect to the corresponding preset refresh number; and determining the AR number of the memory with the change curve.

In the present exemplary embodiment, the change curve of the data retention capacity Y with respect to the corresponding preset refresh number N may be obtained, and due to the natural inconsistency of the data retention capacity Y of each row of the array of the DRAM, the change curve may be a periodic curve, and the cycle thereof is an AR number required for refreshing the entire array once, i.e., the AR number required to be measured in the present exemplary embodiment.

Since only one refresh is performed by one AR command and automatic exit is performed after the refresh, the number of the AR operations is required to be set; that is, the number of the refreshes is preset, so as to perform a required refresh task. For example, the DRAM chip has 100 rows, and if only 2 rows are refreshed by each AR command, 50 ARs are required to refresh all the rows.

1) if the preset refresh number N is determined to be 60, after one refresh of the 100 rows of the entire array, a refresh is performed again from row 1 to about row 20, and at this point, the data retention capacity is Y1=Ret(60).

2) if the preset refresh number N is determined to be 110, after two refreshes of the 100 rows of the entire array, a refresh is performed again from row 1 to about row 20, and at this point, the data retention capacity is Y2=Ret(110).

Since the refresh is performed to row 20 in both cases 1) and 2), the data retention capacity of the entire array should depend on the weakest row of the last 80 rows, and therefore, Y1=Y2.

From the above, the function Ret(N) corresponding to the change curve is a periodic function with the cycle being the AR number of the memory. The AR number may be obtained when the function Ret(N) is obtained, and the number of the rows refreshed by the AR command every time may be determined with the AR number, i.e., the total number of the rows of the memory divided by the AR number. Taking the above as an example, the DRAM chip has 100 rows, and the number of the rows is divided by the AR number 50 to obtain the number 2 of the rows refreshed by the AR command every time, and in practice, the number of the rows refreshed every time is also unknown, and the number of the rows refreshed by the AR command of each chip may be determined only after the AR number is obtained with the method for testing an AR number according to the present exemplary embodiment.

Figure 11:
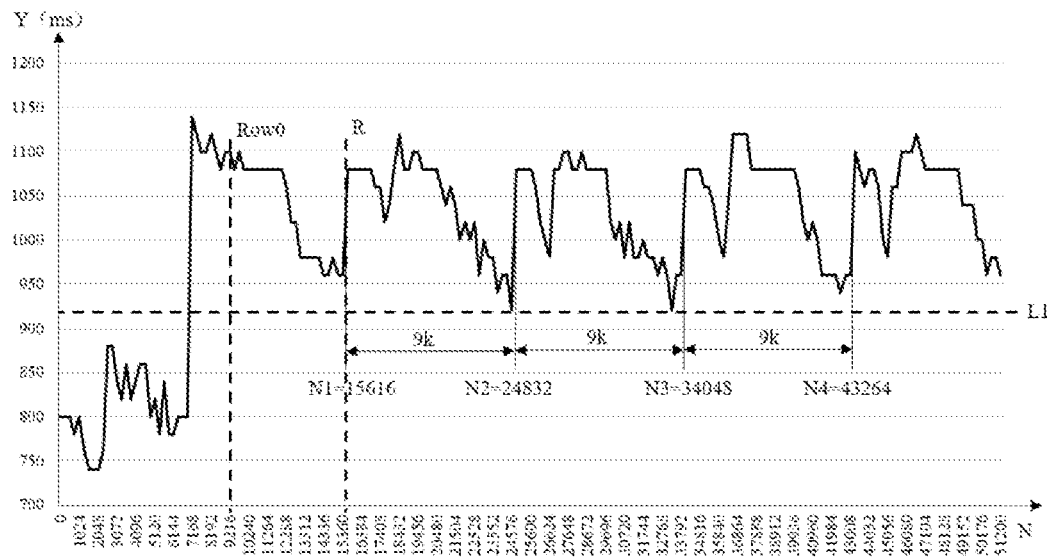
FIG. 11 schematically shows a schematic diagram of an experimental result obtained with a method for testing an AR number according to an exemplary embodiment of the present disclosure.

Reference is made to FIG. 11 which schematically shows a schematic diagram of an experimental result obtained with a method for testing an AR number according to the exemplary embodiment. As shown in FIG. 11, the preset refresh number N serves as the abscissa, and the data retention capacity serves as the ordinate; it may be observed that the function Y=Ret(N) is a periodic function, and three periodic segments are labeled in the drawing: N2-N1=9216=9K (with K being 1024), N3-N2=9216=9K, and N4-N3=9216=9K; that is, the curve Y=Ret(N) has a cycle 9K which is the AR number when the entire array of the memory is completely refreshed once.

The above result is obtained by testing the AR number of the DRAM chip CC with a known design goal. In order to verify validity of the above result, the SR operation is necessary to be performed on the chip CC to obtain the SR cycle thereof, and the SR cycle is obtained according to the method for testing an SR cycle. The method for testing an SR cycle will be described in detail later in the exemplary embodiment of the present disclosure, and only the SR cycle result measured with the method for testing an SR cycle is used herein.

After the SR cycle of the memory is determined according to the method for testing an SR cycle, the interval between two adjacent internal refreshes of the memory is obtained according to the SR current test method; and an internal SR number may be determined according to the SR cycle and the interval.

For example, in the present exemplary embodiment, the chip CC has an SR cycle of 300 ms measured with the method for testing an SR cycle, and this result is obtained by a test experiment of the chip CC at 45° C., and consistent with an SR cycle at a similar temperature in the design goal of the chip CC (that is, close to the SR cycle of 340.2 ms corresponding to 42° C. in Table 1).

TABLE 1

| Design goal of CC chip | |
| --- | --- |
| Temperature (° C.) | SR cycle (ms) |
| 26 | 421.2 |
| 42 | 340.2 |
| 58 | 170.1 |
| 74 | 81.0 |
| 88 | 48.6 |

FIG. 3 schematically shows the schematic diagram of the experimental result of the current waveform of the chip CC obtained with the existing current test method. The cycles obtained from the current waveform diagram are 35.341 μs and 35.227 μs with an average value of 35.284 μs, and the above-mentioned cycle value is the interval between two adjacent internal SRs, i.e., an SR interval.

The SR cycle of 300 ms is divided by the above-mentioned interval of 35.284 μs to obtain the internal SR number 300 ms/35.284 μs≈8K (K=1024) required for refreshing the entire array of the chip CC once.

From the above result, the AR number required for automatically refreshing the entire array is 9K, the internal SR number required for self-refreshing the entire array is 8K, and the AR number is 1K greater than the SR number.

The chip CC has a design goal that one secret AR is performed every 8 normal ARs to refresh two adjacent rows of possibly hammered rows; that is, in a process of the number of ARs of the chip CC, 8/9 of the ARs are normal refreshes, and 1/9 of the ARs are secret refreshes. As such, in 9K ARs, 9K*8/9=8K ARs are normal refreshes, which is consistent with the result of 8K internal SRs; 1K ARs are secret refreshes, which is consistent with the result that the AR number is 1K greater than the SR number, and therefore, the above test result is consistent with the design goal, and the method for testing an AR number according to the present exemplary embodiment is feasible.

In addition, a row hammer target is the design of the DRAM. On a system where the DRAM is refreshed inadequately, a targeted operation on one row of the DRAM may affect memory values of adjacent rows. Such a hammer has a result that one or more bits values in a physical memory (in this case, a GPU memory) is flipped and a new access to a target system may be provided. A row hammer protection circuit means that a row hammer protection logic circuit is added into the DRAM, and if an address is detected to be accessed constantly, two adjacent rows (a previous row and a next row) of a hammered row may be secretly refreshed during the ARs, thus ensuring that the bit value flip may be avoided between the two adjacent rows of the hammered row. Different DRAM chips may have different row hammer protection logics and strengths, and each DRAM may have a different design logic.

With the method for testing an AR number according to the exemplary embodiment of the present disclosure, not only the AR number may be obtained, but also the number of the secret refreshes of the row hammer protection circuit may be determined according to the difference value of the AR number and the internal SR number, so as to perform row hammer protection logic analysis on the chip. The number of the secret refreshes may reflect, from another aspect, whether the chip has the row hammer protection circuit or not, the protection strength for the row hammer and a protection overhead.

Specifically, when the number of the secret refreshes is greater than 0, it may be determined that the chip is provided with the row hammer protection logic circuit. That is, whether the chip is provided with the row hammer protection logic circuit or not may be determined with the number of the secret refreshes. A comparison among a plurality of chips shows that the larger the number of the secret refreshes of the chip, the higher the row hammer protection strength thereof, and the smaller the number of the secret refreshes of the chip, the lower the row hammer protection strength thereof. The protection overhead refers to the number of the secret refreshes, and the more the secret refreshes, the larger the protection overhead; and vice versa.

Table 2 shows a comparison of test results of three types of chips AA, BB, CC. In Table 2, at least two of the three types of chips are used for test calculation, with numbers being AA1, AA2, BB1, BB2, CC1 and CC2 respectively.

TABLE 2

| Chip type | Chip number | Lowest data retention capacity | SR cycle | AR number | Internal SR number | SR interval |
|---|---|---|---|---|---|---|
| AA | AA1 | 3.522 s | 710 ms | 24K | 24K | 27.63 µs |
|  | AA2 | 2.949 s | 715 ms | 24K | 24K | 27.63 µs |
| BB | BB1 | 3.686 s | 195 ms | 13K | 8K | 24.54 µs |
|  | BB2 | 3.768 s | 200 ms | 13K | 8K | 24.54 µs |
| CC | CC1 | 1.064 s | 300 ms | 9K | 8K | 35.28 µs |
|  | CC2 | 0.655 s | 287.5 ms | 9K | 8K | 35.28 µs |

Figure 12:
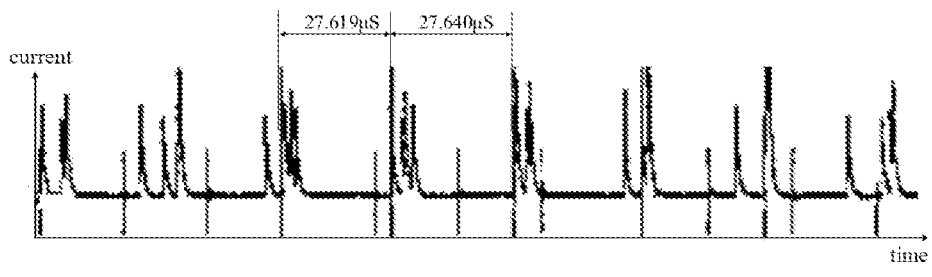
FIG. 12 schematically shows a schematic diagram of an experimental result of a current waveform of a chip AA obtained in a prior SR process.

The SR interval in Table 2 is obtained from the experimental result of the current waveform of the chip CC acquired with the current test method, FIG. 3 already shows the average SR interval of 35.284 µs of the chip CC, and the average SR intervals of the chips AA and BB may be determined to be (27.619+27.640)/2=27.630 µs and (24.550+24.525)/2=24.538 µs from FIGS. 12 and 5 respectively.

The internal SR number in Table 2 may be determined from the SR cycle and the SR interval. Since the three types of chips AA, BB and CC have a same capacity of 65536 rows, the numbers of the rows in each SR and each AR may be determined according to the internal SR number (the numbers of the rows in each SR and each AR are identical). For the chip CC, 65536/8K=8 rows are refreshed each time; the chips BB and CC have the same number of rows in each refresh; the number of the rows in each refresh of the chip AA is ⅓ that of the chip CC, and from the above results, the chip AA has lower power consumption than the chips CC and BB, which is matched with actual measurement data of the power consumption.

By comparing the internal SR number with the AR number in Table 2, it may be observed that the chip AA has an internal SR number the same as an AR number, the row hammer protection circuit has 0 secret refreshes, and the chip AA is not designed with the row hammer protection circuit; the chip BB has an AR number 5K larger than an internal SR number, the row hammer protection circuit has 5K secret refreshes, the chip BB is designed with the row hammer protection circuit, and 5 secret refreshes by the row hammer protection circuit are performed every 8 refreshes; the chip CC has an AR number 1K larger than an internal SR number, the row hammer protection circuit has 1K secret refreshes, the chip CC is designed with the row hammer protection circuit, and 1 secret refresh by the row hammer protection circuit is performed every 8 refreshes.

In the exemplary embodiment of the present disclosure, the power consumption of the chip may be judged with the AR number, and the row hammer protection circuit design of the chip may be judged in conjunction with the internal SR number, such that whether the design goal of the chip is achieved by a comparison with the design goal of the chip; competitive product analysis may also be performed to obtain differences among chip products, so as to provide a reference basis for chip performance evaluation.

In addition, in the function of the change of the data retention capacity with the preset refresh number, the row with the worst data retention capacity in the array of the memory may be determined with the preset refresh number corresponding to the lowest data retention capacity, and the generation technology may be restored and adjusted to provide a basis for later production guidance.

In the present exemplary embodiment, as shown in FIG. 11, the preset refresh number corresponding to the lowest data retention capacity is 240 (N value 15616 corresponding to the dotted line R) in the function Y=Ret(N), and since row 0 is refreshed firstly in each AR, and the dashed line Row0 recorded into FIG. 11 in an experiment serves as the row 0, it may be known that the Row0 in a certain AR cycle has a position 9216 in FIG. 11; the row with the worst data retention capacity, i.e., row (15616−9216)/9K*65536=45511, may be determined according to the proportion of the preset refresh number 15616 corresponding to the lowest data retention capacity in the function curve accounting for the AR number. That is, in the array of the chip, the row 45511 in the total 65536 rows has the worst data retention capacity. As may also be seen from FIG. 11, the row with the worst data retention capacity has a data retention capacity of 920 ms (Y value corresponding to the dotted line L1).

In conclusion, the preset number of AR operations are performed, the change curve of the data retention capacity with respect to the corresponding preset refresh number is obtained, and according to the change curve, not only the AR number of the memory may be determined, but also the row address with the worst data retention capacity may be obtained, and power consumption and row hammer protection logic analysis may be performed on the chip. The AR number may be determined by the simple change curve of the data retention capacity with respect to the corresponding preset refresh number, with a simple detection process and an easy data processing operation; since the change curve is also a periodic curve, the AR number may be determined with the cycle of the change curve, thereby improving the precision of the determination result. The determined power consumption and weakest row may also be used for the later production guidance, such that the generation technology may be restored and adjusted to improve the process yield of the whole chip.

In addition, in the method for testing an SR cycle and the method for testing an AR number according to the present disclosure, only standard commands of the DRAM are used; that is, the SR cycle and the AR number may be tested with the standard commands, such that the SR cycle and the AR number may be tested according to the present disclosure at a wafer level, a packaged chip level or a system level. Compared with the conventional current test method, the method according to the present disclosure avoids extra welding work, thus saving a cost and improving an efficiency; and the method according to the present disclosure may realize mass production tests of different levels of DRAMs.

It should be noted that, the steps of the method in the present invention are described in a specific sequence in the accompanying drawings; however, this does not require or imply that the steps must be executed based on the specific sequence, or that an expected result cannot be implemented unless all of the shown steps are executed. Additionally or alternatively, some steps may be omitted, multiple steps may be combined into one step for execution, and/or one step may be broken down into multiple steps for execution.

Figure 13:
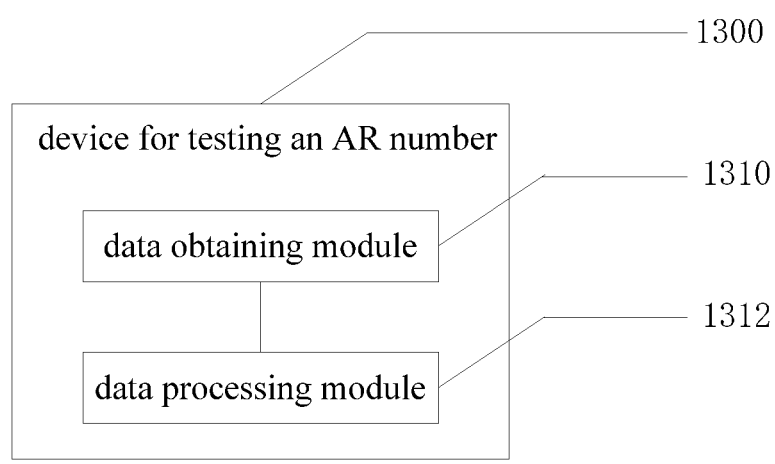
FIG. 13 schematically shows a block diagram of a device for testing an AR number according to an exemplary embodiment of the present disclosure.

Furthermore, the present exemplary embodiment further provides a device for testing an AR number used for a memory. Referring to FIG. 13, the device 1300 for testing an AR number may include a data obtaining module 1310 and a data processing module 1320.

The data obtaining module 1310 may be configured to execute a preset number of AR operations to obtain a corresponding data retention capacity, the AR operation including sending an AR command and waiting for a first preset time; and change the preset refresh number to obtain the corresponding data retention capacity; and The data processing module 1320 may be configured to obtain a change curve of the data retention capacity with respect to the corresponding preset refresh number, and determine the AR number of the memory with the change curve.

The specific details of the above-mentioned virtual modules of the device for testing an SR cycle are described in detail in the corresponding method for testing an SR cycle, and therefore are not repeated herein.

It should be noted that although several modules or units of the devices for testing an SR cycle are described above, such division is not mandatory. In fact, according to the embodiments of the present disclosure, the features and functions of two or more modules or units described above may be embodied in one module or unit. Conversely, the features and functions of a module or unit described above can be further divided into multiple modules or units.

In addition, the drawings are merely schematic descriptions of processes included in the methods according to exemplary embodiments of the present disclosure, and are not for limiting the present disclosure. It is easy to understand that the processes shown in the drawings do not indicate or limit the chronological order of these processes. In addition, it is also easy to understand that these processes may be performed synchronously or asynchronously in multiple modules, for example.

Those skilled in the art will readily contemplate other embodiments of the present disclosure after considering the specification and practicing the disclosure. The present application is intended to cover any variations, uses, or adaptive changes of the present disclosure. These variations, uses, or adaptive changes follow the general principles of the present disclosure and include the common general knowledge or conventional technical means in this art which is not described herein. The specification and embodiments should be considered as exemplary only, and the true scope and spirit of the disclosure should be defined by the appended claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claim.

What is claimed is:

1. A method for testing a self refresh (SR) cycle used for a memory, the method comprising:
   executing a preset number of data-retention-capacity acquisition steps, the data-retention-capacity acquisition steps including determining a preset refresh time;
   sending an SR entry command to control the memory to enter an SR operation;
   sending an SR exit command to control the memory to exit the SR operation after the memory executes SR for the preset refresh time;
   detecting a current data retention capacity of the memory;
   obtaining a cycle of a function of a data retention capacity with respect to a corresponding preset refresh time; and
   determining the SR cycle of the memory with the cycle of the function;
   wherein the step of detecting the current data retention capacity of the memory comprises:
      performing a data reading step, the data reading step comprising determining a preset waiting time;
      waiting for the preset waiting time after the memory executes the SR for the preset refresh time;
      reading data of the memory after waiting for the preset waiting time;
      when the data is successfully read, incrementing the preset waiting time and proceeding to the data reading step; and
      when the data is not successfully read, determining a previous preset waiting time as the data retention capacity, wherein the previous preset waiting time is a previous longest preset waiting time in which the data may be read successfully.

2. The method for testing an SR cycle according to claim 1, wherein a row address with a worst data retention capacity in an array of the memory is determined according to the preset refresh time corresponding to a lowest data retention capacity in the function.

3. The method for testing an SR cycle according to claim 2, wherein the row address with the worst data retention capacity is determined according to a proportion of the preset refresh time corresponding to the lowest data retention capacity in the function accounting for the SR cycle.

4. The method for testing an SR cycle according to claim 1, wherein a step diameter of increasing the preset waiting time is 1-30 μs.

5. The method for testing an SR cycle according to claim 1, wherein the step of obtaining the cycle of the function of the data retention capacity with respect to the corresponding preset refresh time comprises:
obtaining a curve of the data retention capacity changing with the preset refresh time; and
determining the cycle of the function according to the curve.

6. The method for testing an SR cycle according to claim 5, wherein the cycle of the function is equal to the SR cycle of the memory.

7. The method for testing an SR cycle according to claim 1, wherein the SR entry command further comprises:
controlling the memory to be powered down and then powered up, and rewriting the data before controlling the memory to enter the SR operation.

8. The method for testing an SR cycle according to claim 1, wherein the step of executing, by the memory, the SR for the preset refresh time comprises:
rewriting the data into a memory cell of the memory after the data is read out from the memory cell.

9. The method for testing an SR cycle according to claim 1, further comprising:
when the data is not successfully read from a beginning, decrementing the preset waiting time until the data is successfully read, and determining a current preset waiting time as the data retention capacity.

10. A device for testing a self refresh (SR) cycle used for a memory, comprising:
a data obtaining module configured to execute a preset number of data-retention-capacity acquisition steps, the data-retention-capacity acquisition steps including determining a preset refresh time, send an SR entry command to control the memory to enter an SR operation, send an SR exit command to control the memory to exit the SR operation after the memory executes SR for the preset refresh time, and detect a current data retention capacity of the memory; and
a data processing module configured to obtain a cycle of a function of a data retention capacity with respect to a corresponding preset refresh time, and determine the SR cycle of the memory with the cycle of the function;
wherein the data obtaining module is further configured, in response to detecting the current data retention capacity of the memory, to:
perform a data reading step, the data reading step comprising determining a preset waiting time;
wait for the preset waiting time after the memory executes the SR for the preset refresh time;
read data of the memory after waiting for the preset waiting time;
when the data is successfully read, increment the preset waiting time and proceed to the data reading step; and
when the data is not successfully read, determine a previous preset waiting time as the data retention capacity, wherein the previous preset waiting time is a previous longest preset waiting time in which the data may be read successfully.

11. A method for testing an auto refresh (AR) number, comprising:
executing a preset number of AR operations to obtain a corresponding data retention capacity, each of the AR operations comprising sending an AR command and waiting for a first preset time;
changing a preset refresh number to obtain the corresponding data retention capacity;
obtaining a change curve of a data retention capacity with respect to a corresponding preset refresh number; and
determining the AR number with the change curve;
wherein the obtaining the corresponding data retention capacity comprises:
executing a data reading step, the data reading step comprising waiting for a second preset time after executing the preset number of AR operations;
reading data after waiting for the second preset time;
when the data is successfully read, incrementing the second preset time, proceeding to the data reading step until the data is unable to be read, and determining a previous second preset time as the data retention capacity, wherein the previous second preset time is a previous longest second preset time in which the data may be read successfully; and
when the data is not successfully read, decrementing the second preset time, proceeding to the data reading step until the data is read, and determining a current second preset time as the data retention capacity.

12. The method for testing an AR number according to claim 11, wherein a step diameter of increasing or decrement the second preset time is 1-30 μs.

13. The method for testing an AR number according to claim 11, wherein the determining the AR number with the change curve comprises:
obtaining a cycle of the change curve; and
determining the AR number with the cycle of the change curve.

14. The method for testing an AR number according to claim 13, wherein the cycle of the change curve is equal to the AR number.

15. The method for testing an AR number according to claim 11, wherein the first preset time is longer than or equal to 25 μs; a step diameter of preset refresh number is less than or equal to 256.

16. The method for testing an AR number according to claim 11, further comprising:
determining a row number in each refresh by the AR command according to the AR number.

17. The method for testing an AR number according to claim 16, wherein the determining the row number in each refresh by the AR command according to the AR number comprises:
determining a total row number of a memory divided by the AR number as the row number in each refresh.

18. The method for testing an AR number according to claim 11, wherein the AR command further comprises:
controlling a memory to be powered down and up, and rewriting the data before controlling the memory to enter the AR operations.

19. The method for testing an AR number according to claim 11, wherein the executing the preset number of the AR operations comprises:
rewriting the data into a memory cell of a memory after the data is read out from the memory cell.

* * * * *